US007339965B2

(12) United States Patent
Ledentsov et al.

(10) Patent No.: US 7,339,965 B2
(45) Date of Patent: Mar. 4, 2008

(54) OPTOELECTRONIC DEVICE BASED ON AN ANTIWAVEGUIDING CAVITY

(75) Inventors: Nikolai Ledentsov, Berlin (DE); Vitaly Shchukin, Berlin (DE)

(73) Assignee: Innolume GmbH, Dortmund (DE)

( * ) Notice: Subject to any disclaimer, the term of this patent is extended or adjusted under 35 U.S.C. 154(b) by 197 days.

(21) Appl. No.: 11/099,360

(22) Filed: Apr. 5, 2005

(65) Prior Publication Data
US 2005/0226294 A1    Oct. 13, 2005

Related U.S. Application Data

(60) Provisional application No. 60/560,149, filed on Apr. 7, 2004.

(51) Int. Cl.
*H01S 5/00* (2006.01)
*H01S 3/13* (2006.01)

(52) U.S. Cl. .............................. 372/45.01; 372/29.022
(58) Field of Classification Search ...................... None
See application file for complete search history.

(56) References Cited

U.S. PATENT DOCUMENTS

| 3,660,673 | A | * | 5/1972 | Anderson | 359/330 |
| 3,760,292 | A | | 9/1973 | Kogelnik et al. | 331/94.5 |
| 4,665,421 | A | * | 5/1987 | Borner et al. | 257/436 |
| 4,740,987 | A | | 4/1988 | McCall, Jr. et al. | 372/96 |
| 4,944,569 | A | * | 7/1990 | Boudreau et al. | 385/95 |
| 5,264,715 | A | | 11/1993 | Guenter et al. | 257/98 |
| 5,295,147 | A | * | 3/1994 | Jewell et al. | 372/45.01 |
| 5,363,398 | A | * | 11/1994 | Glass et al. | 372/92 |
| 5,389,797 | A | * | 2/1995 | Bryan et al. | 257/21 |
| 5,539,759 | A | * | 7/1996 | Chang-Hasnain et al. | 372/19 |
| 5,727,014 | A | * | 3/1998 | Wang et al. | 372/96 |
| 5,757,837 | A | | 5/1998 | Lim et al. | 372/50 |

(Continued)

FOREIGN PATENT DOCUMENTS

EP    0342953    11/1989

(Continued)

OTHER PUBLICATIONS

Vertical-Cavity Surface-Emitting Lasers: Design, Fabrication, Characterization, and Applications by C.W. Wilmsen, H. Temkin, L.A. Coldren (editors), Cambridge University Press, 1999.

(Continued)

*Primary Examiner*—Minsun Oh Harvey
*Assistant Examiner*—Sean Hagan
(74) *Attorney, Agent, or Firm*—Brown & Michaels, PC

(57) ABSTRACT

A semiconductor optoelectronic device includes at least one cavity and one multilayered interference reflector. The cavity is designed preferably to possess properties of an antiwaveguiding cavity, where no optical modes propagate in the lateral plane. The existing optical modes are the modes propagating in the vertical direction or in a direction tilted to the vertical direction at an angle smaller than the angle of the total internal reflection at the semiconductor/air interface. This design reduces the influence of parasitic optical modes and improves characteristics of optoelectronic devices including vertical cavity surface emitting lasers, tilted cavity lasers emitting through the top surface or the substrate, vertical or tilted cavity resonant photodetectors, vertical or tilted cavity resonant optical amplifiers, and light-emitting diodes.

15 Claims, 9 Drawing Sheets

U.S. PATENT DOCUMENTS

| | | | |
|---|---|---|---|
| 5,779,924 | A | 7/1998 | Krames et al. ............... 216/24 |
| 5,973,336 | A | 10/1999 | Hanke et al. ................. 257/94 |
| 5,976,905 | A | 11/1999 | Cockerill et al. ............ 438/36 |
| 6,001,664 | A | 12/1999 | Swirhun et al. .............. 438/31 |
| 6,154,480 | A | 11/2000 | Magnusson et al. ......... 372/96 |
| 6,160,834 | A | 12/2000 | Scott .......................... 372/96 |
| 6,339,496 | B1* | 1/2002 | Koley et al. ................ 359/344 |
| 6,363,093 | B1 | 3/2002 | Glance ...................... 372/50.1 |
| 6,392,256 | B1 | 5/2002 | Scott et al. ................. 257/184 |
| 6,611,539 | B2 | 8/2003 | Ledentsov et al. ........... 372/20 |
| 6,643,305 | B2 | 11/2003 | Bewley et al. ................ 372/45 |
| 2003/0123829 | A1* | 7/2003 | Taylor ........................ 385/131 |
| 2003/0152120 | A1 | 8/2003 | Ledentsov et al. ....... 372/45.01 |
| 2005/0040410 | A1 | 2/2005 | Ledentsov et al. ............ 257/79 |

FOREIGN PATENT DOCUMENTS

| | | |
|---|---|---|
| EP | 0635893 | 1/1999 |
| GB | 2215075 | 9/1989 |
| JP | 06-314846 | 8/1994 |
| JP | 2003-121637 | 4/2003 |

OTHER PUBLICATIONS

Kalliteevskii, M. A., "Coupled Vertical Microcavities" Technical Physics Letters, American Institute of Physics, vol. 23, No. 2, Feb. 1997.

Chen, Quoqiang et al. "Angular Filtering of Spatial Modes in a Vertical-Cavity Surface-Emitting Laser by a Fabry-Perot etalon" Applied Physics Letters, American Institute of Physics, vol. 71, No. 8, Feb. 1999.

Pezeshki B et al., "Multiple Wavelength Light Source using an Asymmetric Waveguide Coupler," Applied Physics Letters, American Institute of Physics. New York, US, vol. 65, No. 2, Jul. 11, 1994, pp. 138-140.

Pezeshki B. et al., "A Gratingless Wavelength Stabilized Semiconductor Laser," Applied Physics Letters, American Institute of Physics. New York, US, vol. 69, No. 19, Nov. 4, 1996, pp. 2807-2809.

Bardia Pezeshki et al., "Vertical Cavity Devices as Wavelength Selective Waveguides," Journal of Lightwave Technology, IEEE. New York, US, vol. 12, No. 10, Oct. 1, 1994, pp. 1791-1801.

H.C. Casey, Jr. and M.B. Panish, "Heterostructure Lasers", Part A, Academic Press, New York, 1978, pp. 34-57, 165-167.

A. Yariv, P. Yeh, "Optical Waves in Crystals. Propagation and Control of Laser Radiation", Wiley 1984.

Annual Report of Heinrich Hertz Institute, 2003, http://www.hhi.fraunhofer.de/english/.

V. Bardinal, R. Legros, and C. Fontaine, "In situ measurement of AlAs and GaAs refractive index dispersion at epitaxial growth temperature", *Applied Physics Letters*, vol. 67 (2), pp. 244-246 (1995).

D.E.Aspnes (*Physical Review*, B14 (12), pp. 5331-5343 (1976)).

Ledentsov, Nikolai N., "Nanostructures How Nature Does It", Educational Centre at IOFFE Institute Invited Lecture. Oct. 13, 2000. Http://web.edu.ioffe.ru/lectures/index_en.html.

Deppe, D.G., 2000; Optoelectronic Properties of Semiconductors and Superlattices:, vol. 10, Vertical-Cavity Surface-Emitting Lasers: Technology and Applications; pp. 1-61.

Meade, R.D. et al; 1993;"Accurate theoretical analysis of photonic band-gap materials"; Physical Review B 48:11, pp. 8434-8437.

Born, M. et al; 1980; "Principles of Optics"; 6$^{th}$ edition, Pergamon Press, pp. 1-70.

N.N. Ledentsov and V.A. Shchukin. "Novel concepts for Injection Lasers" Opt. Eng. vol. 41, No. 12, 2002, pp. 3193-3203.

N.N. Ledentsov and V.A. Shchukin. "Novel to Approaches to Semiconductor Lasers" Proceedings of SPIE, vol. 4905, 2002, pp. 222-234.

* cited by examiner

US 7,339,965 B2

OPTOELECTRONIC DEVICE BASED ON AN ANTIWAVEGUIDING CAVITY

REFERENCE TO RELATED APPLICATIONS

This application claims an invention which was disclosed in Provisional Application No. 60/560,149, filed Apr. 7, 2004, entitled "OPTOELECTRONIC DEVICE BASED ON AN ANTIWAVEGUIDING CAVITY". The benefit under 35 USC §(119)(e) of the U.S. provisional application is hereby claimed, and the aforementioned application is hereby incorporated herein by reference.

The subject matter in this application is related to the subject matter disclosed in U.S. patent application Ser. No. 10/943,044, filed Sep. 16, 2004, entitled "TILTED CAVITY SEMICONDUCTOR OPTOELECTRONIC DEVICE AND METHOD OF MAKING SAME". The aforementioned application is hereby incorporated herein by reference.

BACKGROUND OF THE INVENTION

1. Field of the Invention

The invention pertains to the field of optoelectronic devices. More particularly, the invention pertains to edge-emitting lasers, surface emitting lasers, wavelength-tunable lasers, optical amplifiers, photodetectors, optical switches, and light-emitting diodes.

2. Description of Related Art

A prior art semiconductor diode laser, or more specifically, an edge-emitting laser, is shown in FIG. 1(a). The laser structure (100) is grown epitaxially on an n-doped substrate (101). The structure further includes an n-doped cladding layer (102), a waveguide (103), a p-doped cladding layer (108), and a p-contact layer (109). The waveguide (103) includes an n-doped part (104), a confinement layer (105) with an active region (106) inside the confinement layer, and a p-doped part (107). The n-contact (111) is contiguous with the substrate (101), and a p-contact (112) is mounted on the p-contact layer (109). The active region (106) generates light when a forward bias (113) is applied. The profile of the optical mode in the vertical direction (z) is determined by the refractive index profile in the z-direction.

The waveguide (103) is bounded in the lateral plane by a front facet (116) and a rear facet (117). If a special highly reflecting coating is put on the rear facet (117), the laser light (115) is emitted only through the front facet (116).

The substrate (101) is preferably formed from any III-V semiconductor material or III-V semiconductor alloy, e.g. GaAs, InP, or GaSb. GaAs or InP are generally used depending on the desired emitted wavelength of laser radiation. The substrate (101) is preferably either a slice of a bulk crystal or an epilayer deposited on the slice of a bulk crystal. Alternatively, sapphire, SiC or Si (111) can be used as substrates for GaN-based lasers, i.e. laser structures the layers of which are formed of GaN, AlN, InN, or alloys of these materials. The substrate (101) is doped by an n-type, or donor impurity. Possible donor impurities include, but are not limited to S, Se, Te, and amphoteric impurities like Si, Ge, or Sn where the latter are introduced under such technological conditions that they are incorporated predominantly into the cation sublattice and serve as donor impurities.

The n-doped cladding layer (102) is preferably formed from a material lattice-matched or nearly lattice-matched to the substrate (101), is transparent to the generated light, and is doped by a donor impurity. In the case of a GaAs substrate (101), the n-doped cladding layer is preferably formed from a GaAlAs alloy or an In(Ga,Al)P alloy lattice matched or nearly lattice matched to a GaAs substrate.

The n-doped part (104) of the waveguide (103) is preferably formed from a material lattice-matched or nearly lattice-matched to the substrate (101), is transparent to the generated light and is doped by a donor impurity. In the case of a GaAs substrate, the n-doped part (104) of the waveguide is preferably formed of a GaAlAs alloy having an Al content lower than that in the n-doped cladding layer (102), or of GaAs.

The p-doped part (107) of the waveguide (103) is preferably formed from a material lattice-matched or nearly lattice-matched to the substrate (101), is transparent to the generated light and is doped by an acceptor impurity. Preferably, the p-doped part (107) of the waveguide is formed from the same material as the n-doped part (104), but doped by an acceptor impurity. Possible acceptor impurities include, but are not limited to, Be, Mg, Zn, Cd, Pb, Mn and amphoteric impurities like Si, Ge, or Sn where the latter are introduced under such technological conditions that they are incorporated predominantly into the anion sublattice and serve as acceptor impurities.

The p-doped cladding layer (108) is preferably formed from a material lattice-matched or nearly lattice-matched to the substrate (101), is transparent to the generated light, and is doped by an acceptor impurity. Preferably, the p-doped cladding layer (108) is formed from the same material as the n-doped cladding layer (102), but is doped by an acceptor impurity.

The p-contact layer (109) is preferably formed from a material lattice-matched or nearly lattice matched to the substrate, is transparent to the generated light and is doped by an acceptor impurity. The doping level is preferably higher than that in the p-cladding layer (108).

The metal contacts (111) and (112) are preferably formed from multi-layered metal structures. The metal contact (111) is preferably formed from the structures including, but not limited to, the structure Ni—Au—Ge. Metal contacts (112) are preferably formed from structures including, but not limited to, the structure Ti—Pt—Au.

The confinement layer (105) is preferably formed from a material lattice-matched or nearly lattice-matched to the substrate (101), is transparent to the generated light, and is undoped or weakly doped. The confinement layers are preferably formed from the same material as the substrate (101).

The active region (106) placed within the confinement layer (105) is preferably formed by any insertion, the energy band gap of which is narrower than that of the substrate (101). Possible active regions (106) include, but are not limited to, a single-layer or a multi-layer system of quantum wells, quantum wires, quantum dots, or any combination thereof. In a device on a GaAs-substrate, examples of the active region (106) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

One of the major shortcomings of the edge-emitting laser is a variation of the energy band gap with temperature resulting in an undesirable temperature dependence of the wavelength of emitted light, particularly for high output power operation.

FIG. 1(b) shows schematically a prior art surface emitting laser, particularly, a vertical cavity surface emitting laser (VCSEL) (120). The active region (126) is put into a cavity (123), which is sandwiched between an n-doped bottom mirror (122) and a p-doped top mirror (128). The cavity (123) includes an n-doped layer (124), a confinement layer (125), and a p-doped layer (127). Bragg reflectors each including a periodic sequence of alternating layers having low and high refractive indices are used as a bottom mirror (122) and a top mirror (128). The active region (126) generates light when a forward bias (113) is applied. Light comes out (135) through the optical aperture (132). The wavelength of the emitted laser light from the VCSEL is determined by the length of the cavity (123).

The layers forming the bottom mirror (122) are preferably formed from materials lattice-matched or nearly lattice matched to the substrate (101), are transparent to the generated light, are doped by a donor impurity and have alternating high and low refractive indices. For a VCSEL grown on a GaAs substrate, alternating layers of GaAs and GaAlAs or layers of GaAlAs having alternating aluminum content preferably form the mirror.

The n-doped part (124) of the cavity (123) is preferably formed from a material lattice-matched or nearly lattice-matched to the substrate (101), is transparent to the generated light and is doped by a donor impurity.

The p-doped part (127) of the cavity (123) is preferably formed from a material lattice-matched or nearly lattice-matched to the substrate (101), is transparent to the generated light and is doped by an acceptor impurity.

The layers forming the top mirror (128) are preferably formed from materials lattice-matched or nearly lattice-matched to the substrate (101), are transparent to the generated light, are doped by an acceptor impurity and have alternating high and low refractive indices. For a VCSEL grown on a GaAs substrate, alternating layers of GaAs and GaAlAs or layers of GaAlAs having alternating aluminum content preferably form the mirror.

The p-contact layer (129) is preferably formed from a material doped by an acceptor impurity. For a VCSEL grown on a GaAs substrate, the preferred material is GaAs. The doping level is preferably higher than that in the top mirror (128). The p-contact layer (129) and the metal p-contact (112) are etched to form an optical aperture (132). The doping profile is optimized to reach a possibly low resistance of the device.

The confinement layer (125) is preferably formed from a material lattice-matched or nearly lattice-matched to the substrate (101), is transparent to the generated light, and is undoped or weakly doped. The confinement layers are preferably formed from the same material as the substrate (101).

The active region (126) placed within the confinement layer (125) is preferably formed by any insertion, the energy band gap of which is narrower than that of the substrate (101). Possible active regions (126) include, but are not limited to, a single-layer or a multi-layer system of quantum wells, quantum wires, quantum dots, or any combination thereof. In a device on a GaAs-substrate, examples of the active region (126) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

The active region (126) generates optical gain when a forward bias (113) is applied. The active region (126) then emits light which is bounced between the bottom mirror (122) and the top mirror (128). The mirrors have high reflectivity for light propagating in the direction normal to the p-n junction plane, and the reflectivity of the bottom mirror (122) is preferably higher than that of the top mirror (128). Thus, the VCSEL design provides a positive feedback for light propagating in the vertical direction and finally results in lasing. The laser light (135) comes out through the optical aperture (132).

One of the major advantages of a VCSEL is temperature stabilization of the wavelength. Temperature variations of the wavelength follow the temperature variations of the refractive index, which is an order of magnitude smaller than the variations of the semiconductor band gap energy. One severe disadvantage of a VCSEL is that its output power is limited by a few mW, as it is not possible to provide efficient heat dissipation in the VCSEL geometry.

SUMMARY OF THE INVENTION

The invention discloses a semiconductor optoelectronic device including at least one cavity and one multilayered interference reflector. The cavity is designed preferably to possess properties of an antiwaveguiding cavity, where no optical modes having a significant overlap with the active medium propagate in the lateral plane. The existing optical modes are the modes propagating in the vertical direction or in a direction tilted to the vertical direction, such that the tilt angle is smaller than the angle of the total internal reflection at the semiconductor-air interface and light in such optical modes comes out of the device through the top surface or the substrate. This design reduces the influence of parasitic optical modes and improves characteristics of optoelectronic devices including, but not limited to, vertical cavity surface emitting lasers, tilted cavity lasers emitting through the top surface or a substrate, vertical or tilted cavity resonant photodetectors, vertical or tilted cavity resonant optical amplifiers, and light-emitting diodes.

DETAILED DESCRIPTION OF THE INVENTION

Figure 1:
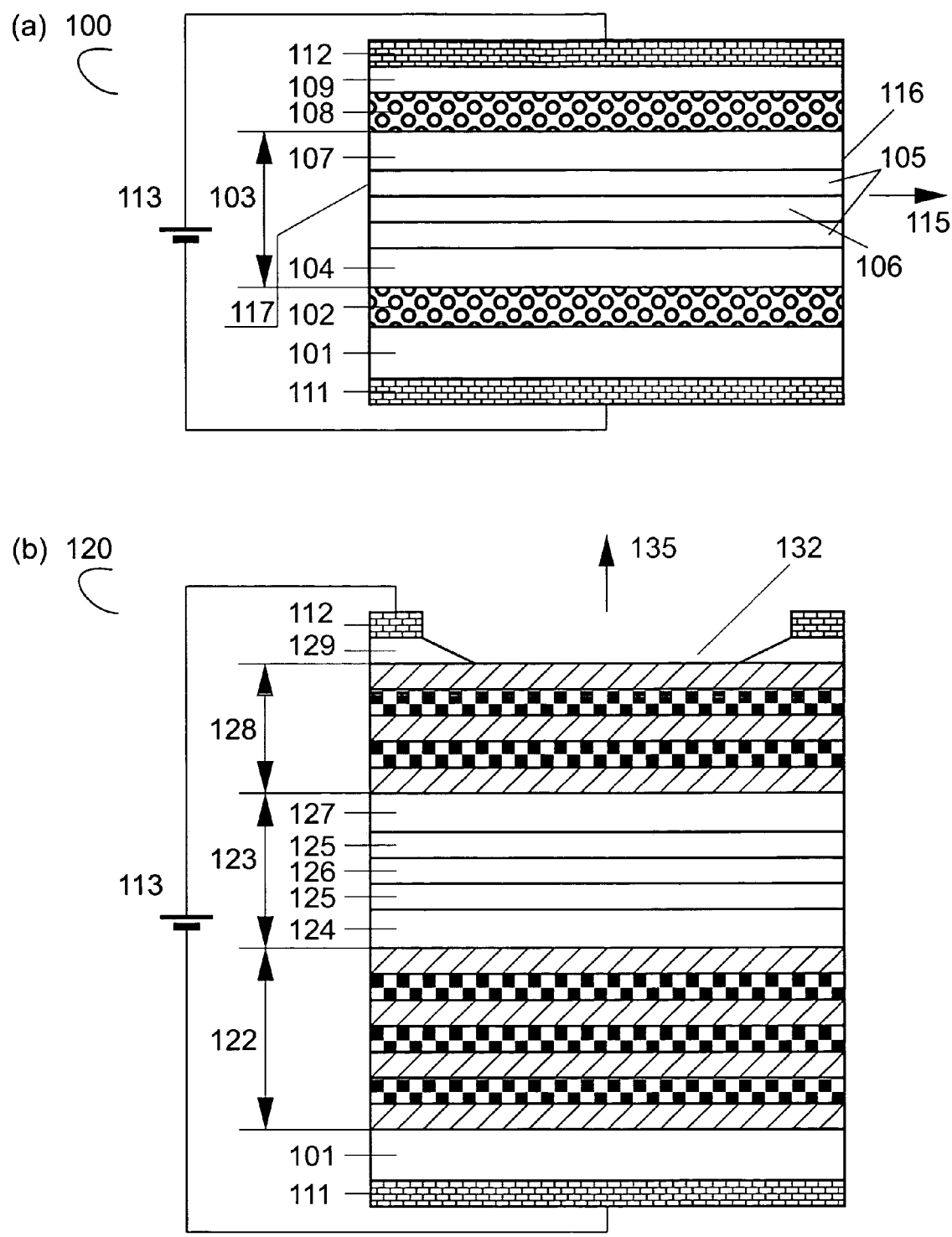
FIG. 1(a) shows a schematic diagram of a prior art edge-emitting laser.
FIG. 1(b) shows a schematic diagram of a prior art vertical cavity surface-emitting laser with doped mirrors.
Figure 2:
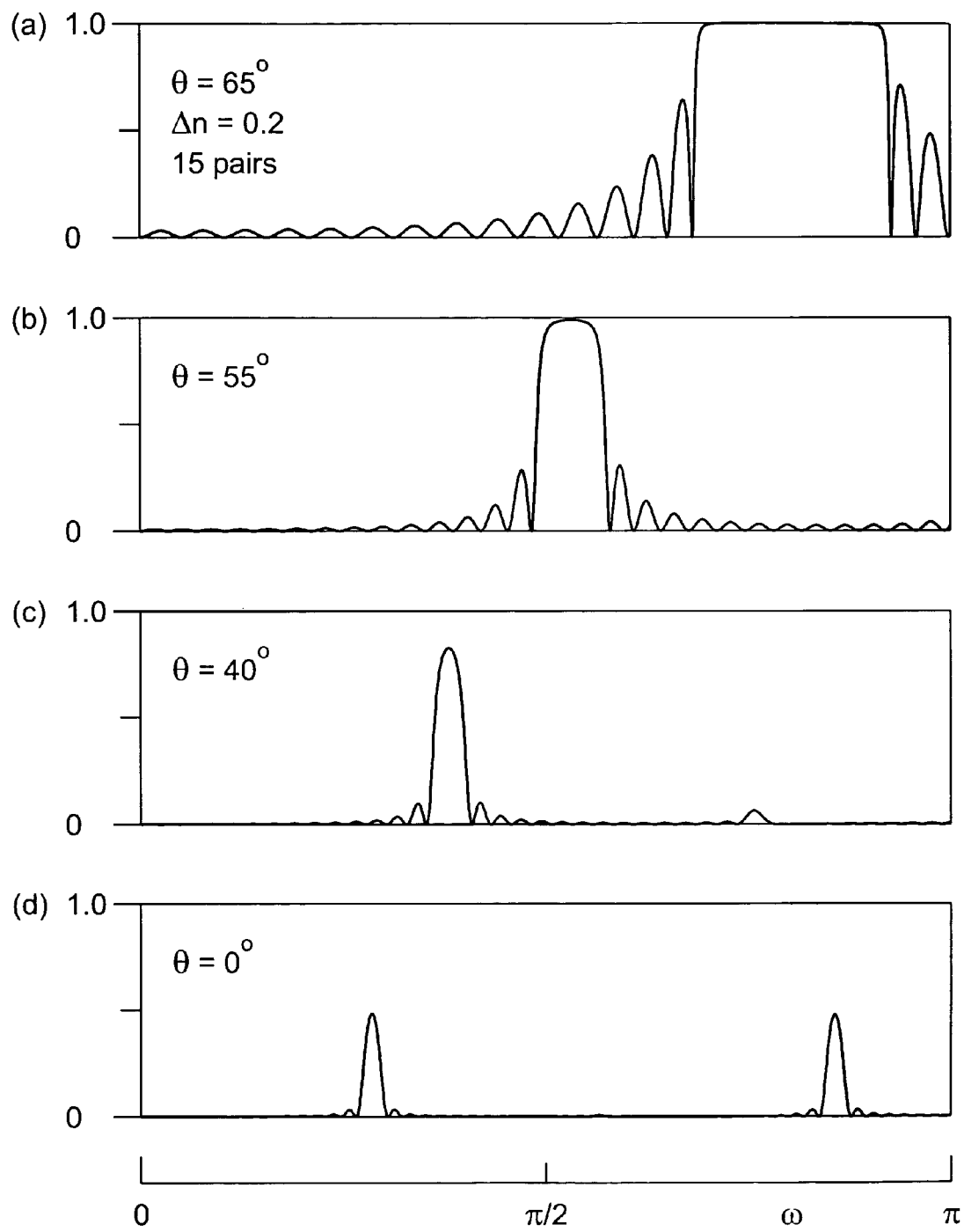
FIG. 2(a) shows a reflectivity spectra of a multilayered periodic structure at a 65-degree angle of incidence following A. Yariv and P. Yeh, Optical Waves in Crystals. Propagation and Control of Laser Radiation (Wiley 1984).
FIG. 2(b) shows the reflectivity spectra of a multilayered periodic structure at a 55-degree angle of incidence following A. Yariv and P. Yeh, Optical Waves in Crystals. Propagation and Control of Laser Radiation (Wiley 1984).
FIG. 2(c) shows the reflectivity spectra of a multilayered periodic structure at a 40-degree angle of incidence following A. Yariv and P. Yeh, Optical Waves in Crystals. Propagation and Control of Laser Radiation (Wiley 1984).
FIG. 2(d) shows the reflectivity spectra of a multilayered periodic structure at a 0-degree angle of incidence following A. Yariv and P. Yeh, Optical Waves in Crystals. Propagation and Control of Laser Radiation (Wiley 1984).
Figure 3:
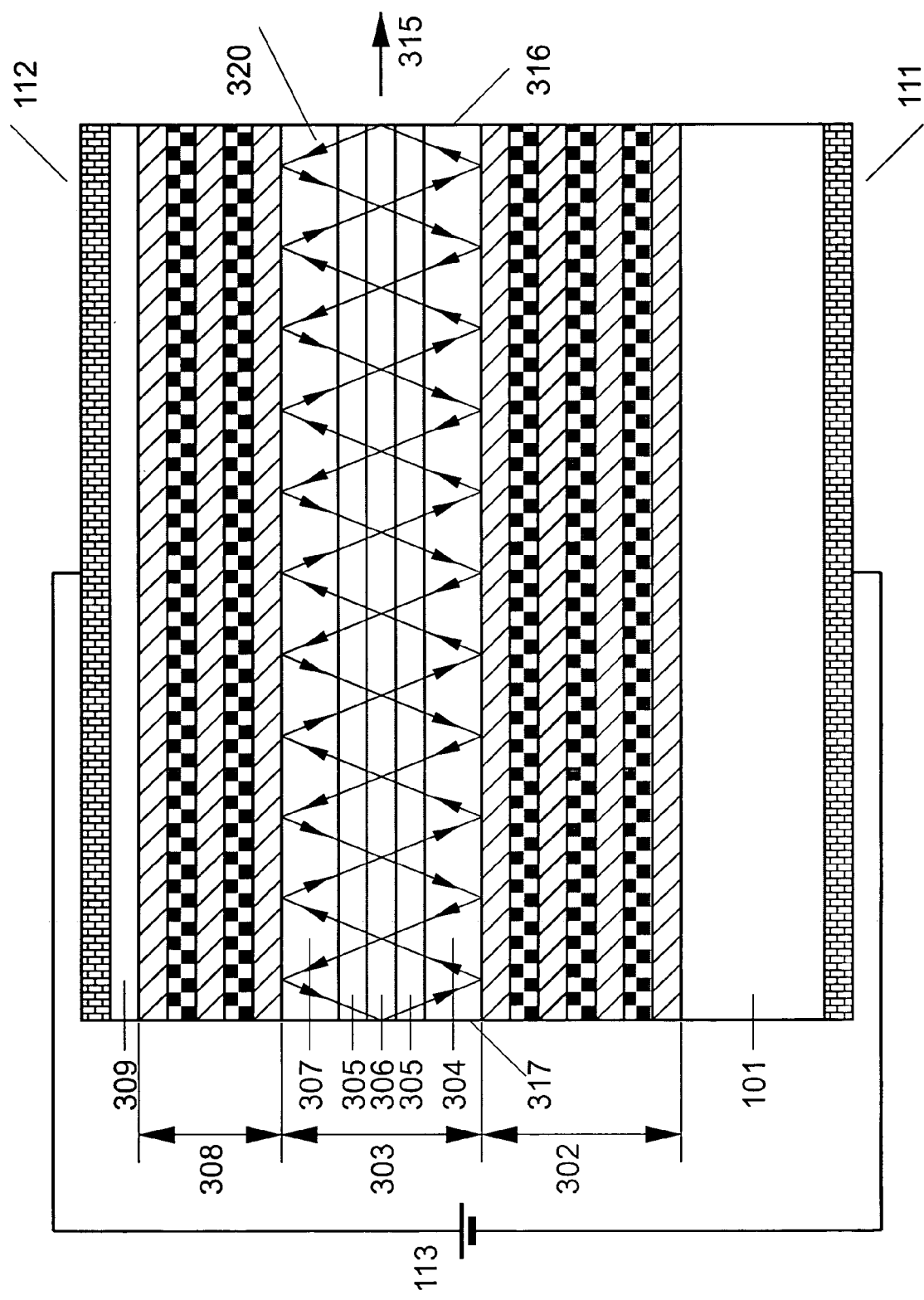
FIG. 3 shows a schematic diagram of a tilted cavity laser disclosed in the U.S. Patent Publication 2003/0152120, by the present inventors, filed Feb. 12, 2002.

One way to overcome the shortcomings of both an edge-emitting laser and a VCSEL is related to the concept of a tilted cavity optoelectronic device. This concept is based on the fundamental physical properties of multilayered structures, i.e, on the laws of propagation/transmission/reflection of electromagnetic waves at oblique incidence. FIGS. 2(a) through 2(d) illustrate the reflectivity spectrum of a periodic multilayered structure for a few different tilt angles (65°, 55°, 40°, and 0°, respectively) of the propagating TE electromagnetic wave, as disclosed by Yariv et al. (A. Yariv, P. Yeh, "Optical Waves in Crystals. Propagation and Control of Laser Radiation", Wiley 1984). Light comes from the medium with a refractive index $n_1$ =3.6, and the structure includes 15 periods. Each period includes one layer of $\Lambda/2$ thickness having a low refractive index $n_2$ =3.4 and one layer of $\Lambda/2$ thickness having a high refractive index $n_1$ 3.6. The reflectivity is plotted as a function of the normalized frequency ($\omega \Lambda/c$), where w is the frequency of the electromagnetic wave, c is the velocity of light in the vacuum, and $\Lambda$ is the thickness of the structure period. The major properties, as seen in FIG. 3, are as follows. At the normal incidence, $\theta=0$, the reflectivity spectrum reveals narrow spikes of a low amplitude. As the angle increases (from 0° to 65° in the figures), i) spikes shifts towards higher frequencies, i.e., towards shorter wavelengths, ii) the amplitudes of the spikes increases, and iii) the spikes become broader, forming stopbands with a reflectivity close to 1.

These properties of the strong dependence of the reflectivity of electromagnetic waves from a multilayered structure on the angle of incidence are the basis for the concept of a tilted cavity semiconductor diode laser. This laser was disclosed in a co-pending U.S. Patent Publication 2003/0152120, entitled "TILTED CAVITY SEMICONDUCTOR LASER (TCSL) AND METHOD OF MAKING SAME", published Aug. 14, 2003, herein incorporated by reference.

The tilted cavity laser (300) is grown epitaxially on an n-doped substrate (101) and includes an n-doped bottom multilayered interference reflector (302), a cavity (303), a p-doped top multilayered interference reflector (308), and a p-contact layer (309). The cavity (303) includes an n-doped layer (304), a confinement layer (305), and a p-doped layer (307). The confinement layer (305) also includes an active region (306). The laser structure (300) is bounded in the lateral plane by a rear facet (317) and a front facet (316). The cavity (303) and the multilayered interference reflectors (302) and (307) are designed such that resonant conditions for the cavity and for the multilayered interference reflectors are met for only one tilted optical mode (320) propagating at a certain tilt angle and having a certain wavelength. If the rear facet (317) is covered by a highly reflecting coating, the output laser light (315) comes out only through the front facet (316). One advantage of this tilted cavity laser is that wavelength stabilization and a high output power are obtained at the same time.

The layers forming the bottom multilayered interference reflector (302) are preferably formed from materials lattice-matched or nearly lattice matched to the substrate (101), are transparent to the generated light, are doped by a donor impurity and have alternating high and low refractive indices. For a tilted cavity laser grown on a GaAs substrate, alternating layers of GaAs and GaAlAs or layers of GaAlAs having alternating aluminum content preferably form the mirror.

The n-doped part (304) of the cavity (303) is preferably formed from a material lattice-matched or nearly lattice-matched to the substrate (101), is transparent to the generated light and is doped by a donor impurity.

The p-doped part (307) of the cavity (303) is preferably formed from a material lattice-matched or nearly lattice-matched to the substrate (101), is transparent to the generated light and is doped by an acceptor impurity.

The layers forming the top multilayered interference reflector (308) are preferably formed from materials lattice-matched or nearly lattice-matched to the substrate (101), are transparent to the generated light, are doped by an acceptor impurity and have alternating high and low refractive indices. For a tilted cavity laser grown on a GaAs substrate, alternating layers of GaAs and GaAlAs or layers of GaAlAs having alternating aluminum content preferably form the mirror.

The p-contact layer (309) is preferably formed from a material doped by an acceptor impurity. For a tilted cavity laser grown on a GaAs substrate, the preferred material is GaAs. The doping level is preferably higher than that in the top multilayered interference reflector (308).

The confinement layer (305) is preferably formed from a material lattice-matched or nearly lattice-matched to the substrate (101), is transparent to the generated light, and is undoped or weakly doped. The confinement layers are preferably formed from the same material as the substrate (101).

The active region (306) placed within the confinement layer (305) is preferably formed by any insertion, the energy band gap of which is narrower than that of the substrate (101). Possible active regions (306) include, but are not limited to, a single-layer or a multi-layer system of quantum wells, quantum wires, quantum dots, or any combination thereof. In a case of the device on a GaAs-substrate, examples of the active region (306) include, but are not limited to, a system of insertions of InAs, $In_{1-x}Ga_xAs$, $In_xGa_{1-x-y}Al_yAs$, $In_xGa_{1-x}As_{1-y}N_y$, or similar materials.

Figure 4:
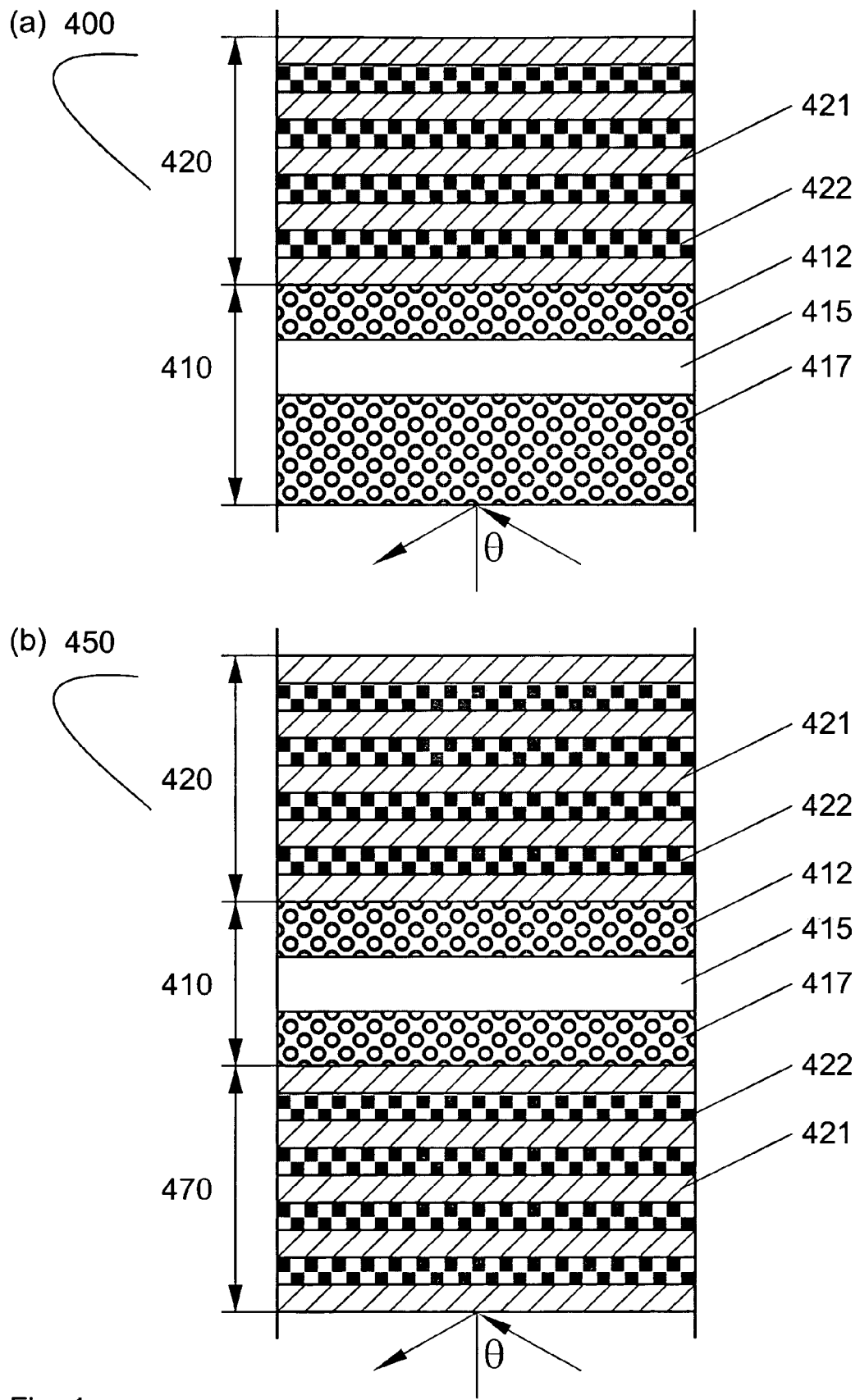
FIG. 4(a) shows a schematic diagram of a tilted cavity laser including a high-finesse cavity and a multilayered interference reflector.
FIG. 4(b) shows a schematic diagram of a structure including a high-finesse cavity sandwiched between two multilayered interference reflectors.

FIG. 4(a) shows schematically a tilted cavity laser according to the U.S. application Ser. No. 10/943,044 filed Sep. 16, 2004, entitled "TILTED CAVITY SEMICONDUCTOR OPTOELECTRONIC DEVICE AND METHOD OF MAK- ING SAME", invented by the inventors of the present invention, and incorporated herein by reference. The structure (400) includes a high-finesse cavity (410) and a multi-layered interference reflector (MIR) (420). The high-finesse cavity (410) includes a layer (415) having a high refractive index sandwiched between a layer (412) and a layer (417) both having refractive indices lower than the refractive index of the layer (415). The reflectivity spectra of the high-finesse cavity (410) at a certain impinging angle $\vartheta$ of light has a narrow dip. The finesse of the cavity defined as a ratio of the wavelength and the width of the dip is preferably larger than 5. The MIR (420) includes a structure of alternating layers (421) having a high refractive index and layers (422) having a low refractive index. Both the spectral position of the reflectivity dip of the cavity (410) and the stopband reflectivity maximum of the MIR (420) are functions of the angle $\vartheta$. The cavity (410) and the MIR (420) are designed such that the spectral position of the cavity dip and of the reflectivity maximum of the MIR stopband coincide at a single angle $\vartheta = \vartheta_0$ and draw apart as the angle deviates from $\vartheta_0$. This particular wavelength $\lambda_0$ is the wavelength at which the tilted optical mode confined within the cavity (410) has the minimum leakage losses through the MIR (420). This promotes the selection of the tilted optical modes of a tilted cavity laser and ensures lasing at this wavelength $\lambda_0$.

FIG. 4(b) shows schematically a structure (450) of a tilted cavity laser according to U.S. application Ser. No. 10/943,044, where a high-finesse cavity (410) is sandwiched between a MIR (420) and a MIR (470). The selection of the tilted optical modes is based on the same principles as at the structure (400).

Figure 5:
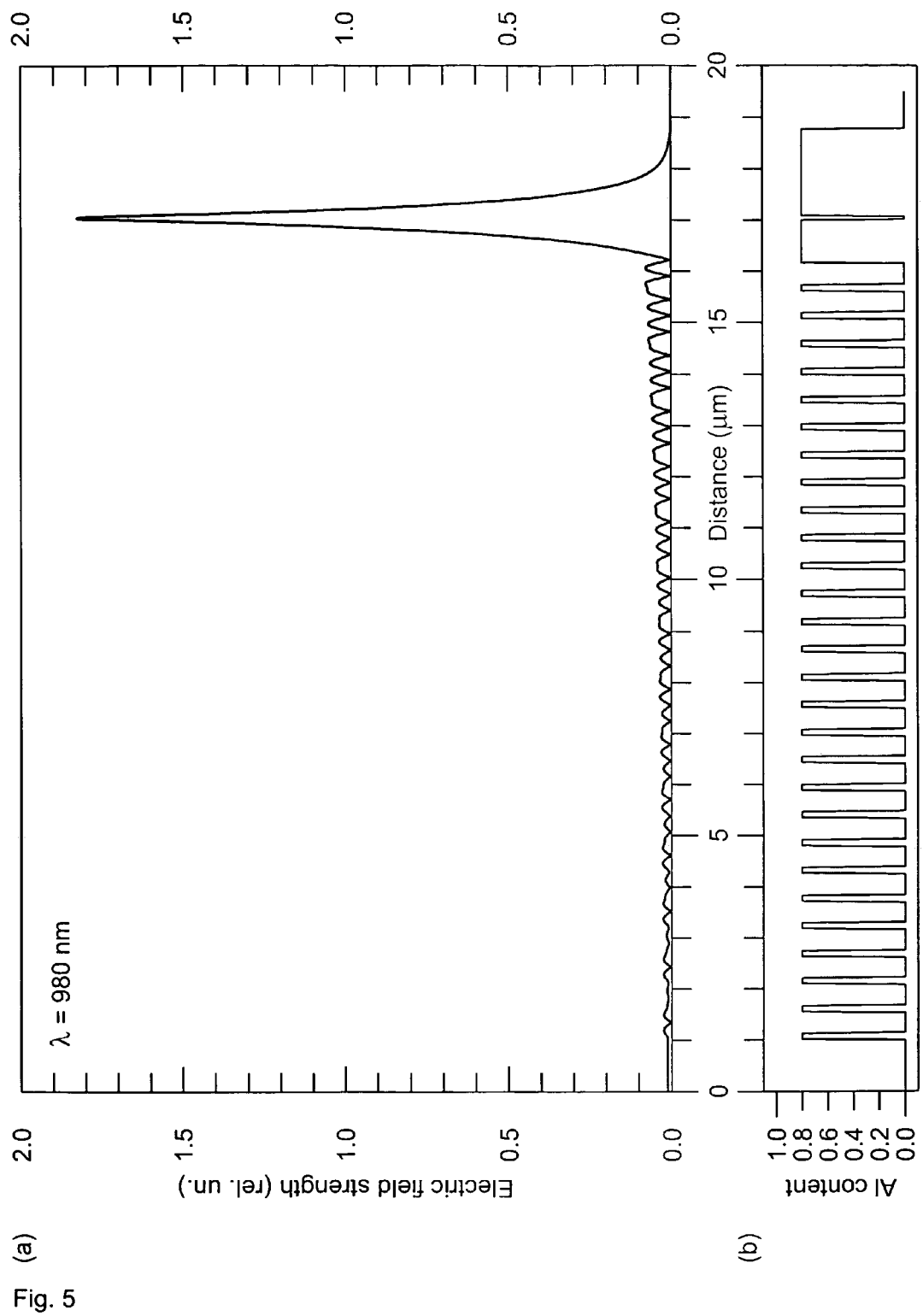
FIG. 5 shows the absolute value of the electric field strength demonstrating the spatial profile of the resonant optical mode in a prior art tilted cavity laser.

FIG. 5(a) shows schematically the spatial profile of the resonant tilted optical mode in a tilted cavity laser according to U.S. application Ser. No. 10/943,044. The tilted cavity laser is based on a GaAs/GaAlAs structure. The aluminum content is shown in FIG. 5(b).

Figure 6:
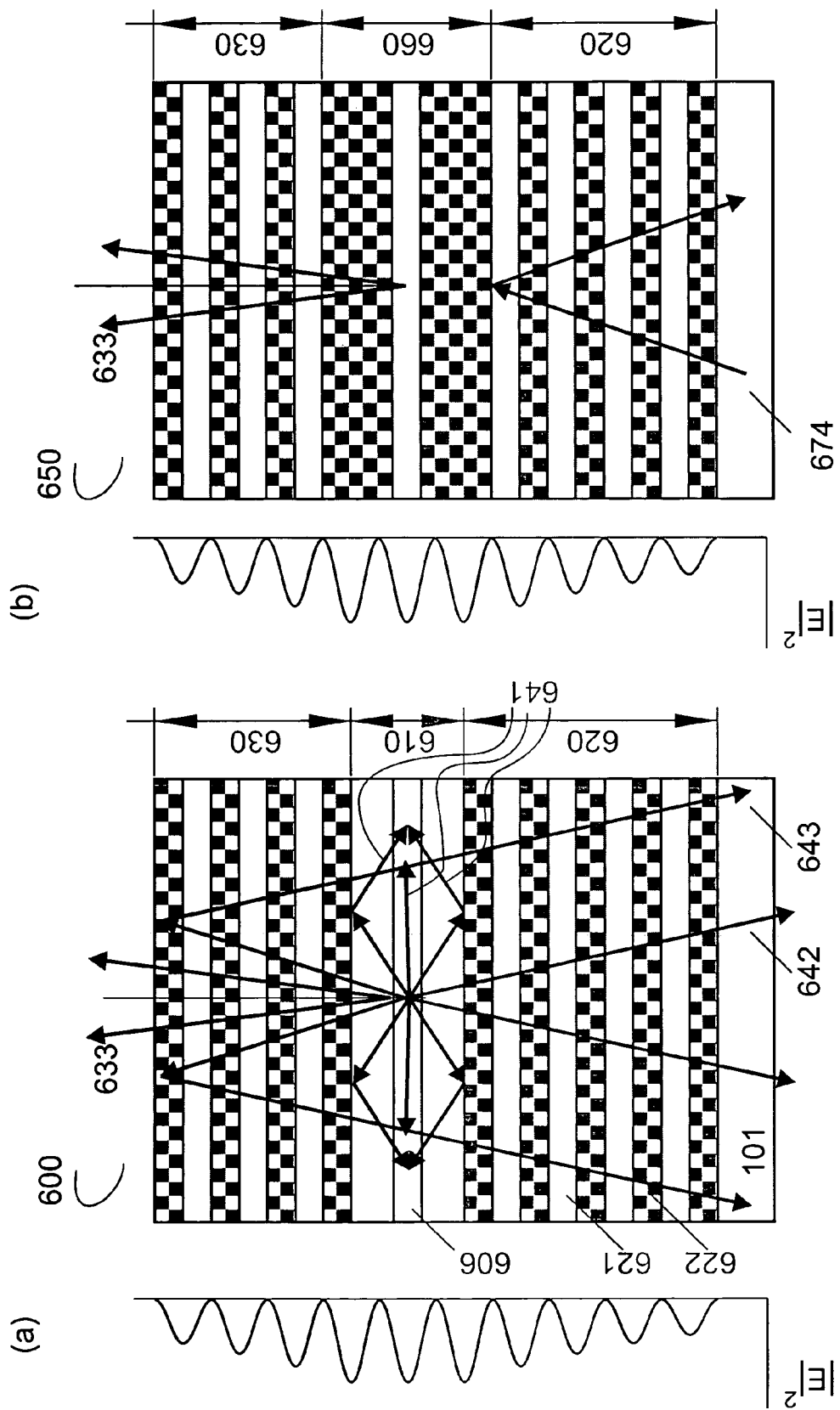
FIG. 6(a) shows a schematic diagram of a prior art vertical cavity surface emitting laser (VCSEL).
FIG. 6(b) shows a schematic diagram of a vertical cavity surface emitting laser (VCSEL) according to an embodiment of the present invention.

FIG. 6 illustrates two possible designs of a vertical cavity surface emitting laser (VCSEL). The same figure also refers to two possible designs of a tilted cavity laser (TCL) where laser light comes out through the top mirror.

A conventional design (600) for a VCSEL, shown in FIG. 6(a), includes a bottom distributed Bragg reflector (DBR) (620), a cavity (610) including an active region (606), and a top DBR (630). Both the bottom DBR (620) and the top DBR (630) include a periodic structure of alternating layers (621) having a first refractive index, and layers (622) having a second refractive index. The second refractive index is lower than the first refractive index. The active region (606) is placed within the cavity (610), which is preferably formed of a material having a low refractive index. Light emission, below the lasing threshold, occurs in a plurality of optical modes which include both the modes propagating through the top mirror, and parasitic modes propagating along the waveguide or leaking into the substrate.

Assuming a 200 nm-wide DBR stopband, the "resonant" cavity emission (for example at 1.3 μm) can be reflected by the DBR only for angles below ~5°. Already at the angle of incidence 10°, the long-wavelength edge of the stopband shifts to 1.27 μm and most of the 1.3 μm emission leaks into the substrate.

Photons, originating from radiative recombination in the active region (606), may leak (642) into the substrate. Additionally, photons impinging on the top semiconductor-air interface at an angle exceeding the angle of the total internal reflection, can not come out of the device. They are reflected back and finally leak (643) into the substrate. Photons, generated in the active region can also be channeled into the lateral waveguide modes (643). As the cavity is usually broad enough, the number of the allowed waveguide modes is high. The resonant optical mode of the device is illustrated in FIG. 6(a) as the dependence of the square of the electric field strength $|E|^2$ on the vertical coordinate (z).

FIG. 6(b) shows a VCSEL (650) according to an embodiment of the present invention. In contrast to the VCSEL of FIG. 6(a), in the VCSEL (650), a cavity (660) is formed of a material having a low refractive index. This structure is an antiwaveguiding structure. In the VCSEL, the active region is placed within a cavity having a low refractive index. Parasitic modes are suppressed. Tilted modes are partially or completely reflected (674) and only the modes, which come with very large angles with respect to the layer surface, penetrate into the active region and have weak overlap with the gain medium. In contrast, only the modes (633) of the vertical resonator remain well defined and provide a high confinement factor. The resonant optical mode of the device is illustrated in FIG. 6(b) as the dependence of the square of the electric field strength $|E|^2$ on the vertical coordinate (z).

One way to make a cavity antiwaveguiding is to provide a relationship between the refractive indices of a cavity and an averaged refractive index of a DBR:

$$n_{cavity} < n_{DBR}, \quad (1)$$

where the averaged refractive index of the DBR is defined as a square root of the weighted averaged square of the refractive index. Thus, for a DBR including a periodic structure where each period further includes a first layer of a thickness $d_1$ and a refractive index $n_1$ and a second layer of a thickness $d_2$ and a refractive index $n_2$, the effective refractive index of the DBR can be approximated as $$n_{DBR} = \sqrt{\frac{n_1^2 d_1 + n_2^2 d_2}{d_1 + d_2}}. \quad (2)$$

In another embodiment of the present invention, a tilted cavity laser is designed such that it includes at least one cavity and at least one multilayered interference reflector (MIR) designed such that the refractive index of the cavity is lower than the effective refractive index of the MIR, which enables an efficient suppression of parasitic optical modes.

Layers that compose the VCSEL (650) should obey the above-described relationship (Eq. (1)) between the refractive indices and are preferably lattice-matched or nearly lattice-matched to the substrate. The active medium, realized as a single-layer or a multilayer structure of quantum wells, arrays of quantum wires, arrays of quantum dots or any combination thereof, may contain thin lattice mismatched layers. In another embodiment, the entire structure of the device is grown on a metamorphic (plastically relaxed) buffer, lattice-mismatched to the substrate. The top DBR or the top MIR may be formed of either semiconductor or dielectric layers, or any combination thereof. The possible material combinations are known in the art (e.g., *Vertical-Cavity Surface-Emitting Lasers: Design, Fabrication, Characterization, and Applications* by C. W. Wilmsen, H. Temkin, L. A. Coldren (editors), Cambridge University Press, 1999, incorporated herein by reference).

In another embodiment of the present invention, a vertical or tilted cavity laser is designed such that the parasitic modes have large leaky losses to the substrate and the contact layers. The leaky losses are preferably higher than 40 dB/cm.

In yet another embodiment of the present invention, a vertical or tilted cavity laser is designed such that the parasitic modes have a small confinement factor in the working p-n junction. The small confinement factor is preferably smaller than the confinement factor of the resonant optical mode by a factor larger than 3. The working p-n junction is the junction emitting light in lasers and optical amplifiers and the junction absorbing light in photodetectors.

In another embodiment of the present invention, a vertical or a tilted cavity laser is designed such that the leaky losses to the substrate or to the contact layers for a first group of parasitic modes are preferably higher than 40 dB/cm. In this embodiment, the confinement factor in the working p-n junction of the optical modes of a second group of parasitic modes are preferably smaller than the confinement factor of the resonant optical mode by a factor of 3.

Purcell Effect in Cavities

Advantages of the antiwaveguiding design are related to the Purcell effect. When the light-emitting oscillator is placed in resonance (both in photon energy and spatially) with the cavity mode of a high-finesse resonator, the Purcell effect reads that the probability of the radiative recombination for this resonance mode is increased by a number of times equal to the finesse of the cavity (Q), if the inhomogeneous broadening is smaller than the cavity dip width. For a quantum dot (QD) VCSEL having a cavity dip of about 0.1 mn and a wavelength of 1300 nm, the Q-factor is estimated to be 1300 nm/0.1 nm, or approximately 13,000. This number corresponds to an average number of photon cycles in the cavity before escape. At low temperatures the homogeneous broadening in QD is very small (a few µeV) and the condition is fulfilled.

The physical reason for such an enhancement is as follows. The same photon interacts resonantly and coherently with the oscillator not once, but the number of times defined by the finesse of the cavity.

At room temperature, deep QDs demonstrate homogeneous broadening of about 1-10 meV, or 1-10 nm (as follows from single QD photoluminescence) and the enhancement of the radiative recombination probability is up to 100-1000 times.

One should note, however, that the angle of the emission, where the enhancement is expected, is very small and defined by the number of confined vertical modes in the cavity. Thus, in spite of the enhancement of the probability for radiative recombination in the vertical direction, it may be well compensated by the emission of light in the parasitic modes, which have a lower probability of radiative recombination, but are available in a very large emission angle. Thus, the Purcell effect is measurable only in situations where the parasitic radiative modes are suppressed. This suppression is usually realized by etching of photonic crystal around the cavity, exhibiting a reflectivity stopband for lateral modes and confining the active vertical mode. Some enhancement may be realized even by using oxide aperture-confined modes (L. A. Graham, D. L. Huffaker, and D. G. Deppe, "Spontaneous lifetime control in a native-oxide-apertured microcavity" Applied Physics Letters, Vol. 74, Issue 17, pp. 2408-2410, 1999) but only at 10 K.

Population of the Waste States

Only the states resonant to the vertical cavity mode (modes) are needed for lasing. Thus, population of the rest of the radiative states on both low and high energy sides can be considered as filling the waste states. In conventional designs, these waste states are radiatively active and result in radiative leakage. Since the number of states to be filled is large in VCSELs (high gain is needed to overcome high external losses), the radiative leakage increases the threshold current and causes additional heat generation.

In the antiwaveguide structure of the present invention, there may be no waveguiding modes. Moreover, no vertical resonant waveguide modes are possible for the emission with wavelength exceeding the resonant cavity wavelength. These states can be then effectively filled with fairly low radiative leakage.

If a tilted cavity laser is designed according to the present invention and includes an antiwaveguiding cavity, the tilted cavity laser has the same advantages as a VCSEL. Since there are no waveguiding optical modes having a significant overlap with the active medium, the number of the parasitic radiative channels is dramatically suppressed.

Transparency Current

In a conventional design, in addition to the fact that radiative recombination leakage occurs, this leakage does not contribute to making the gain medium transparent, as the leaking photons are not absorbed by the active media. For modal absorption of about 10-30 $cm^{-1}$ and 10-20 micrometers VCSEL apertures, the amount of the absorbed photons is negligible.

In contrast, for the resonant vertical (or tilted) mode, light populates the electronic states very effectively, as the absorption is enhanced by the multi-pass nature of resonant modes.

Thus, if conventional modes are suppressed by using an antiwaveguiding structure, the transparency regime may be reached with very small current (suppressed waste states and recycling of resonant photons).

Stimulated Emission Loss

In a conventional VCSEL design, the gain anisotropy is defined by the quantum well or quantum dot symmetry and strain profile, and not by the cavity. Below threshold, light generated by the stimulated emission propagates and is amplified in all directions. The advantage of the VCSEL mode is low losses due to a highly-reflective DBR for a small portion (small angle) of light.

Suppression of the waste radiative modes helps to suppress the stimulated emission leakage channel as well. This is of particular importance for light emitting diodes (LEDs) as the radiation at undesired angles is efficiently eliminated.

Gain

Having only a limited number of possible channels for stimulated emission results in a predominant concentration of photons in the optical modes distributed in a relatively narrow range of angles close to the resonant cavity modes. As the stimulated emission probability is proportional to the density of resonant photons, this leads to an enhancement of the gain only in certain directions even without taking into account the multi-pass nature of the cavity. Higher radiative recombination probability due to the Purcell effect adds to the effect.

Technological Advantages

A conventional VCSEL needs to be fully processed before it is proven that the wafer is good, and the device indeed generates laser light. If the same wafer is tested as a simple edge-emitter (stripe or four-side cleaved), it operates in a low-loss waveguide mode and surface lasing is not possible. In contrast, in the antiwaveguide VCSEL of the present invention, no waveguide modes are possible and vertical lasing may be realized and detected, e.g. as diffracted light at the facets and corners, from the scratched back side in vertical direction, etc. This dramatically reduces the time for evaluation and enables faster development loops.

Further Embodiments of Antiwaveguide Optoelectronic Devices

Another embodiment of the present invention discloses a tilted cavity laser, which is designed to generate laser light in a resonant tilted optical mode. The laser light comes out in a vertical direction through the top mirror or through the bottom mirror to the substrate. In the tilted cavity laser of this embodiment, a cavity having a low refractive index is sandwiched between two multilayered interference reflectors (MIR) having a high averaged refractive index. Schematically, FIG. 6(b) refers also to such tilted cavity lasers, but the cavity and the MIRs are designed such that a tilted optical mode characterized by a certain tilt angle is the resonant mode with the minimum leakage loss.

Another embodiment of the present invention discloses a resonant photodetector, which operates in a vertical cavity geometry or in a tilted cavity geometry and includes a cavity exhibiting an antiwaveguiding effect.

Figure 9:
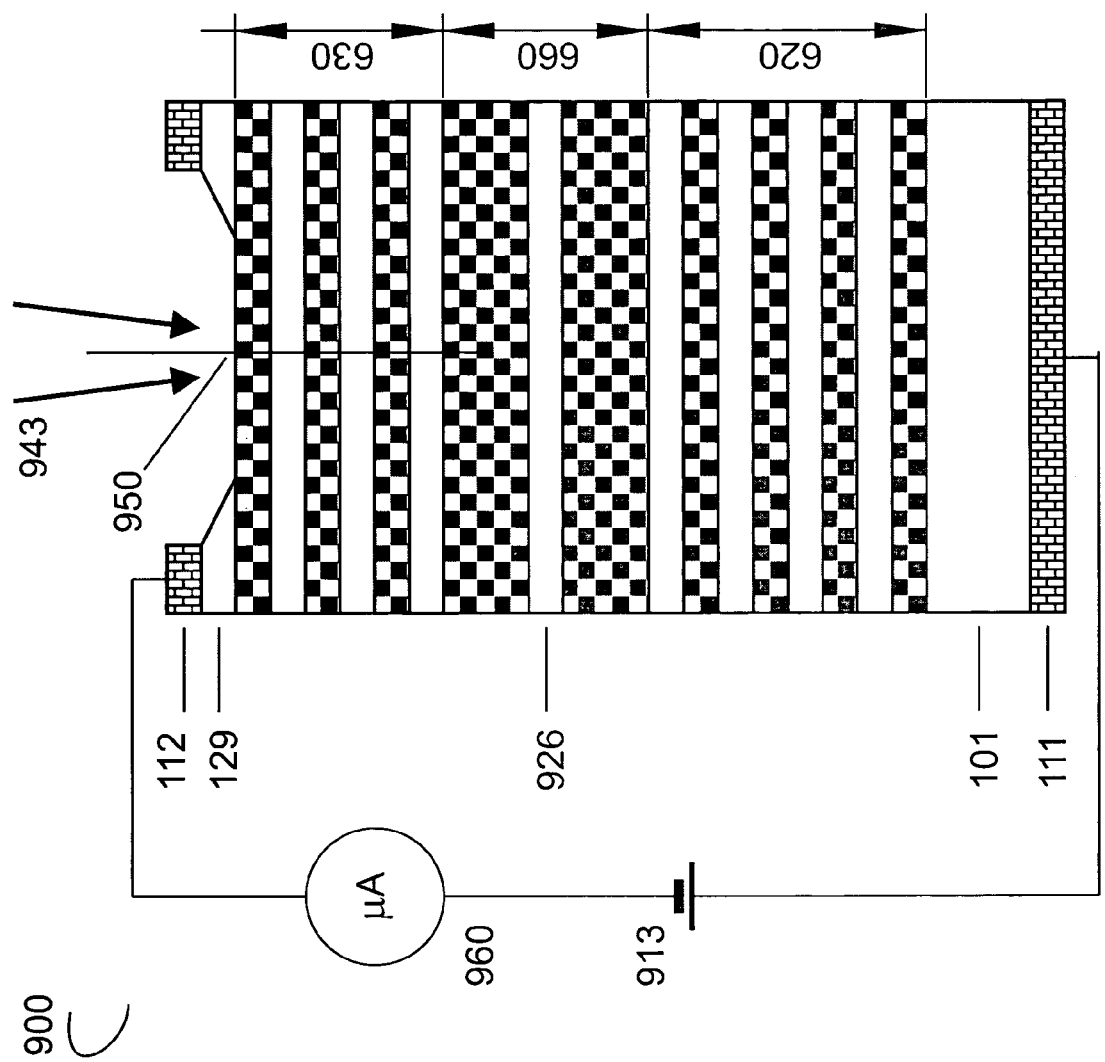
FIG. 9 illustrates schematically a resonant cavity photodetector based on an antiwaveguiding cavity, according to another embodiment of the present invention.

FIG. 9 shows schematically a photodetector (900) based on an antiwaveguiding cavity according to an embodiment of the present invention. The device (900) operates under a reverse bias (913). When no light is absorbed at the p-n junction placed preferably in the layer (926) within the antiwaveguiding cavity (660), no current flows through the device. When external light (943) impinges on the top surface of the device at sufficiently small angles with respect to the normal direction (950), photons are absorbed within the p-n junction, generating electron-hole pairs. Electrons and holes are driven apart by an electric field creating a photocurrent. The photocurrent may be measured by a microampermeter (960).

A novel feature of this photodetector is that only light in certain optical modes having a sufficient overlap with the p-n junction contribute to the photocurrent. Thus, in addition to the selectivity in wavelengths of incoming light, the photodetector (900) is also selective in the direction of propagation of the incoming light and detects light propagating only from certain directions. This may be important for certain applications.

Another embodiment is possible, where a resonant cavity photodetector operates in combination with another optoelectronic device, where the latter generates light in an optical mode, which exists outside the device in the form of an evanescent electromagnetic field. The photodetector of the present invention is capable of detecting light in the near field zone of a light generating device.

Yet another embodiment of the present invention discloses an optical amplifier, which operates in a vertical cavity geometry or in a tilted cavity geometry and includes an antiwaveguiding cavity.

Another embodiment of the present invention discloses a light emitting diode (LED), which operates in a vertical cavity geometry or in a tilted cavity geometry and includes an antiwaveguiding cavity.

One skilled in the art will appreciate that the preferred embodiments of a vertical cavity surface emitting laser, a tilted cavity laser, an optical amplifier, a photodetector, or a light-emitting device including an antiwaveguided cavity may be extended in various ways.

Additional layers may be added to the multilayered interference reflector(s) (MIRs) or to the distributed Bragg reflector(s) (DBRs) such that these layers are remote from the active region. Then the part of the MIR or the DBR close to the cavity has the weighted average refractive index according to Eq. (2) that satisfies Eq. (1). Thus, such a device operates as an optoelectronic device including an antiwaveguiding cavity, with all of the above discussed advantages. On the other hand, the refractive index averaged over the entire MIR or DBR including additional remote layers will not necessarily satisfy Eq. (1). For this reason, the refractive index of the cavity is preferably lower than the averaged refractive index of the part of the MIR or the DBR in the close vicinity of the cavity.

Additional layers with similar or different refractive indices to the MIR or the DBR, remote from the active region, do not affect the operation of the device.

Furthermore, new layers may be added such that a second, waveguiding cavity is formed, and parasitic optical modes propagating at large tilt angles to the vertical direction are possible. A necessary condition for the device to operate according to the present invention is that the overlap of such parasitic optical modes with the active medium is small.

Further embodiments additionally include one or more of the following elements: contact layers, contacts, or oxide apertures as is well known in the art (e.g., *Vertical-Cavity Surface-Emitting Lasers: Design, Fabrication, Characterization, and Applications* by C. W. Wilmsen, H. Temkin, L. A. Coldren (editors), Cambridge University Press, 1999). Additionally deposited layers may be both semiconductor layers and dielectric layers or any combination thereof.

The MIR or the DBR may be n-doped from the side of the n-contact. The MIR or the DBR may be p-doped from the side of the p-contact. In an alternative embodiment, the MIR or the DBR may be undoped or only weakly doped from one or both sides, and the contact is preferably realized as an intracavity contact.

All additional elements like contact layers, contacts, oxide apertures, as well as various ways to apply a bias to a p-n junction, e.g. via doped DBRs or via intracavity contacts, where DBRs remain undoped or weakly doped, are well known in the art. The possible material combinations are known in the art for VCSELs (e.g., *Vertical-Cavity Surface-Emitting Lasers: Design, Fabrication, Characterization, and Applications* by C. W. Wilmsen, H. Temkin, L. A. Coldren (editors), Cambridge University Press, 1999). Similar elements and technological solutions are possible for tilted cavity lasers designed to emit light via the top surface or the substrate. Similar elements and solutions are possible for optical amplifiers, for both those designed to work as vertical cavity optical amplifiers and designed to work as tilted cavity optical amplifiers. Similar elements and solutions are possible for resonant cavity photodetectors, for both photodetectors designed to work as vertical cavity photodetectors and those designed to work as tilted cavity photodetectors.

Wavelength-Tunable Resonant Optoelectronic Device Including an Antiwaveguiding Cavity The present invention is also applicable to tunable vertical cavity surface emitting lasers (VCSELs) and tunable tilted cavity lasers, where the cavity includes both a light generating element and a modulator element. The modulator element includes a modulating layer, the refractive index of which can be tuned electronically due to a quantum confinement Stark effect or by the effect of bleaching. Tuning the refractive index within one layer within a cavity results in a shift of the wavelength of the emitted laser light (see N. N. Ledentsov and V. A. Shchukin, "WAVELENGTH-TUNABLE VERTICAL CAVITY SURFACE EMITTING LASER AND METHOD OF MAKING SAME", U.S. Pat. No. 6,611,539, issued Aug. 26, 2003; N. N. Ledentsov and V. A. Shchukin, "INTELLIGENT WAVELENGTH DIVISION MULTIPLEXING SYSTEMS BASED ON ARRAYS OF WAVELENGTH TUNABLE LASERS AND WAVELENGTH TUNABLE RESONANT PHOTODETECTORS", U.S. Patent Publication 2003/0206741, published Nov. 6, 2003. Both documents are herein incorporated by reference).

Let the device include an mλ-cavity and consider the dependence of the wavelength of the spectral resonance of the cavity on the tilt angle $\vartheta$:

$$\lambda_{cavity} = \frac{n_{cavity} d_{cavity}}{m} \cos \vartheta_{cavity}, \tag{3}$$

where $\vartheta_{cavity}$ is the angle of propagation of a tilted mode within the cavity.

The maximum of the reflectivity of the stopband of a MIR is given by $$\lambda_{MIR} = 2 n_{MIR} D_{MIR} \cos \vartheta_{MIR}, \tag{4}$$

where $\vartheta_{MIR}$ is an average angle of propagation of the given tilted mode within a MIR.

The resonant optical mode is determined by the criterion that, at a certain angle of propagation of the optical mode, the resonant wavelength for the cavity coincides with the wavelength of the maximum reflectivity of the stopband of the MIR. This is a criterion of the phase matching between the cavity and the MIR. Let now the refractive index of the cavity be varied. Then the optical mode at a different wavelength no longer corresponds to the reflectivity stopband maximum of the MIR, and phase matching conditions are violated. If the stopband of the MIR is narrow, the phase matching conditions are of high importance as they insure low leakage losses of the optical mode. If the refractive index of the cavity is increased such that the wavelength of the cavity mode is shifted out of the stopband of the MIR, the phase matching conditions are no longer fulfilled and no lasing is possible. If the refractive index of the cavity is decreased, the phase matching conditions may be met at a different angle of propagation and a different wavelength and determine the shift of the wavelength of the resonant optical mode.

In contrast, when the stopband of the MIR is wide, the role of phase matching is not that important. The change of the resonant wavelength is determined mainly by the change of the refractive index of the cavity. These two situations lead to different consequences for a waveguiding and for an antiwaveguiding design of the device.

Consider first a conventional "waveguiding" design of a device, where $$n_{cavity} > n_{MIR}. \tag{5}$$

An inverse relationship holds for the angles of the propagation of tilted modes in the cavity and in the MIR, $$\vartheta_{cavity} < \vartheta_{MIR}. \tag{6}$$

Figure 7:
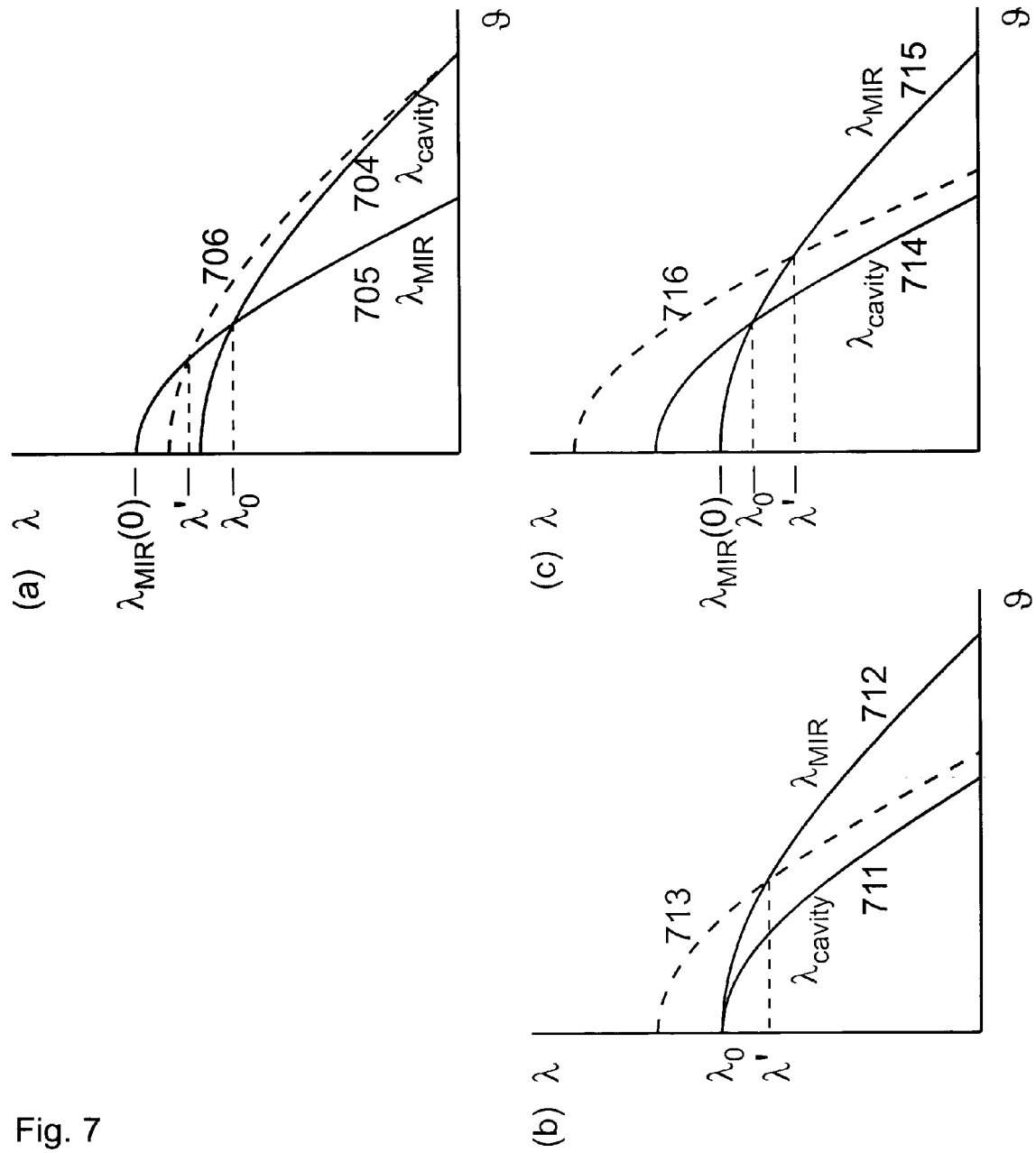
FIG. 7(a) shows a schematic diagram showing angular dependence of a resonant wavelength of a cavity and the wavelength of the maximum stopband reflectivity of a multilayered interference reflector (MIR).
FIG. 7(b) shows a schematic diagram showing angular dependence of a resonant wavelength of a cavity and the wavelength of the maximum stopband reflectivity of a multilayered interference reflector (MIR).
FIG. 7(c) shows a schematic diagram showing angular dependence of a resonant wavelength of a cavity and the wavelength of the maximum stopband reflectivity of a multilayered interference reflector (MIR).

Now the resonant wavelength of the cavity according to Eq. (3) and the wavelength of the maximum stopband reflectivity according to Eq. (4) are plotted as a function of a single angle, e.g. $\vartheta = \vartheta_{cavity}$. Then, as $\vartheta_{MIR} > \vartheta_{cavity}$, according to Eq. (6), $\lambda_{MIR}$ vanishes at a smaller angle than $\lambda_{cavity}$, and the two curves, (704) for $\lambda_{cavity}(\vartheta)$, and (705) for $\lambda_{MIR}(\vartheta)$ behave as shown in FIG. 7(a). The cavity in FIG. 7(a) has a higher refractive index than the MIR. The cavity and the MIR are designed such that the resonant mode is a tilted mode propagating in a direction tilted with respect to the direction normal to the lateral plane.

Now let the refractive index of a modulator be varied such that the average refractive index of the cavity increases, $$n'_{cavity} = n_{cavity} + \Delta n > n_{cavity}. \tag{7}$$

The corresponding shift of the resonant wavelength depends on an interplay between two effects. The first effect is an average change of the refractive index of the cavity. The second effect is related to the matching conditions between adjacent layers forming the cavity, particularly, between the modulator and neighboring layers. The relative importance of these two effects depends on the relationship between the width of the stopband of the MIR at the normal incidence, $\Delta\lambda_{stopband}$ and the quantity, $\lambda_{MIR}(0) - \lambda_0$. In the case of a wide stopband, $$\Delta\lambda_{stopband} > |\lambda_{MIR}(0) - \lambda_0|, \tag{8}$$

the shift of the wavelength is mainly determined by the change of the average refractive index of the cavity, and phase-matching conditions do not play a role. If the average refractive index of the modulator increases, according to Eq. (7), the resonant wavelength also increases. In the case of a narrow stopband, $$\Delta\lambda_{stopband} < |\lambda_{MIR}(0) - \lambda_0|, \tag{9}$$

the matching conditions begin to play an important role. The resonant wavelength is then determined by the intersection point of two curves, $\lambda_{cavity}(\vartheta)$ and $\lambda_{MIR}(\vartheta)$. If the refractive index of the cavity increases according to Eq. (7), then the resonant wavelength of the cavity is described by the dashed curve (706) instead of (704). Then the wavelength of the intersection point shifts to a longer wavelength, and $$\lambda' > \lambda_0. \tag{10}$$

Thus, for a waveguiding tilted cavity device, an increase in the average refractive index of the cavity leads to a shift of the resonant wavelength to larger values.

A different situation occurs for an antiwaveguiding cavity where $$n_{cavity} < n_{MIR}. \tag{11}$$

In this case, if the stopband is wide, the shift of the resonant wavelength is again determined mainly by the variation of the average refractive index of the cavity. Then, if the refractive index of the modulator is varied such that the average refractive index of the cavity increases, the resonant wavelength shifts again to larger values.

A principally different situation occurs if the stopband is narrow. This is illustrated in FIGS. 7(b) and 7(c). For the antiwaveguiding cavity for which Eq. (11) holds, an inverse relationship holds for the angles, $$\vartheta_{cavity} > \vartheta_{MIR}. \tag{12}$$

Consider now a particular case of an antiwaveguiding VCSEL or a tilted cavity laser. Then the two functions given by Eqs. (3) and (4) intersect at the point $\vartheta_{cavity}=\vartheta_{MIR}=0$. Both the resonant wavelength of the cavity and the spectral position of the stopband maximum are plotted as a function of the same angle, say of $\vartheta=\vartheta_{cavity}$. The curve (711) refers to the dependence of the resonant wavelength of the cavity on the angle, and the curve (712) refers to the dependence of the maximum stopband reflectivity on the angle. Then $\lambda_{cavity}<\lambda_{MIR}$ for all the angles except $\vartheta=0$, as shown in FIG. 7(b).

Now let the refractive index of a modulator be varied such that the average refractive index of the cavity increases, $$n'_{cavity}=n_{cavity}+\Delta n>n_{cavity}. \quad (13)$$

Then the dependence of the resonant wavelength of the cavity versus the tilt angle is given by a dashed curve (713) in FIG. 7(b). It intersects with the curve (712) at a wavelength $\lambda'<\lambda_0$. Thus, an increase in the refractive index of the cavity may lead, in this embodiment, to a decrease in the wavelength of the emitted laser light. The cavity and the MIR in FIG. 7(b) are designed such that, when the device operates under a zero voltage applied to the modulator, the resonant mode is a VCSEL mode propagating in the vertical direction.

FIG. 7(c) shows a similar set of curves for a tilted cavity laser. The cavity has a lower refractive index than the MIR. The cavity and the MIR are designed such that the resonant mode is a tilted mode propagating in a direction tilted with respect to the direction normal to the lateral plane. The two curves (714) and (715), standing for $\lambda_{cavity}$ and $\lambda_{MIR}$, respectively, intersect at a non-zero angle corresponding to a resonant tilted optical mode of the device. If the refractive index in a modulator within a cavity is varied such that the average refractive index of the cavity increases, according to Eq. (13), then the angular dependence of the resonant wavelength of the cavity is described as the curve (716). The intersection point of the two curves shifts to a larger tilt angle, and simultaneously, to a shorter wavelength, $\lambda'<\lambda_0$. Thus, in a tilted cavity laser, an increase in the refractive index of the cavity may lead to a decrease in the wavelength of the emitted laser light.

In another embodiment of the present invention, a wavelength-tunable resonant photodetector is disclosed, which has an antiwaveguiding cavity and employs a vertical cavity geometry, or a tilted cavity geometry. In this photodetector, an increase of the refractive index in a modulator results in a decrease of the resonant wavelength of the resonant photodetector.

In another embodiment of the present invention, a wavelength-tunable resonant photodetector is designed such that an increase of the refractive index in a modulator results in an increase of the resonant wavelength of the resonant photodetector.

In yet another embodiment of the present invention, a wavelength-tunable resonant optical amplifier is disclosed which has an antiwaveguiding cavity and employs vertical cavity geometry or tilted cavity geometry. In this optical amplifier, an increase of the refractive index in a modulator results in a decrease of the resonant wavelength of the resonant optical amplifier.

In yet another embodiment of the present invention, a wavelength-tunable resonant optical amplifier is designed such that an increase of the refractive index in a modulator results in an increase in the resonant wavelength of the resonant optical amplifier.

In yet another embodiment of the present invention, a wavelength-tunable light emitting diode (LED) is disclosed, where the spectrum of the emitted light is tuned within the same intrinsic emission band of the gain material. In one embodiment, a wavelength-tunable light emitting diode is designed such that an increase in the refractive index of a modulator results in a decrease of the wavelength of the maximum emission. In another embodiment, a wavelength-tunable light emitting diode is designed such that an increase in the refractive index of a modulator results in an increase of the wavelength of the maximum emission.

Fine Tuning of the Resonant Wavelength

Figure 8:
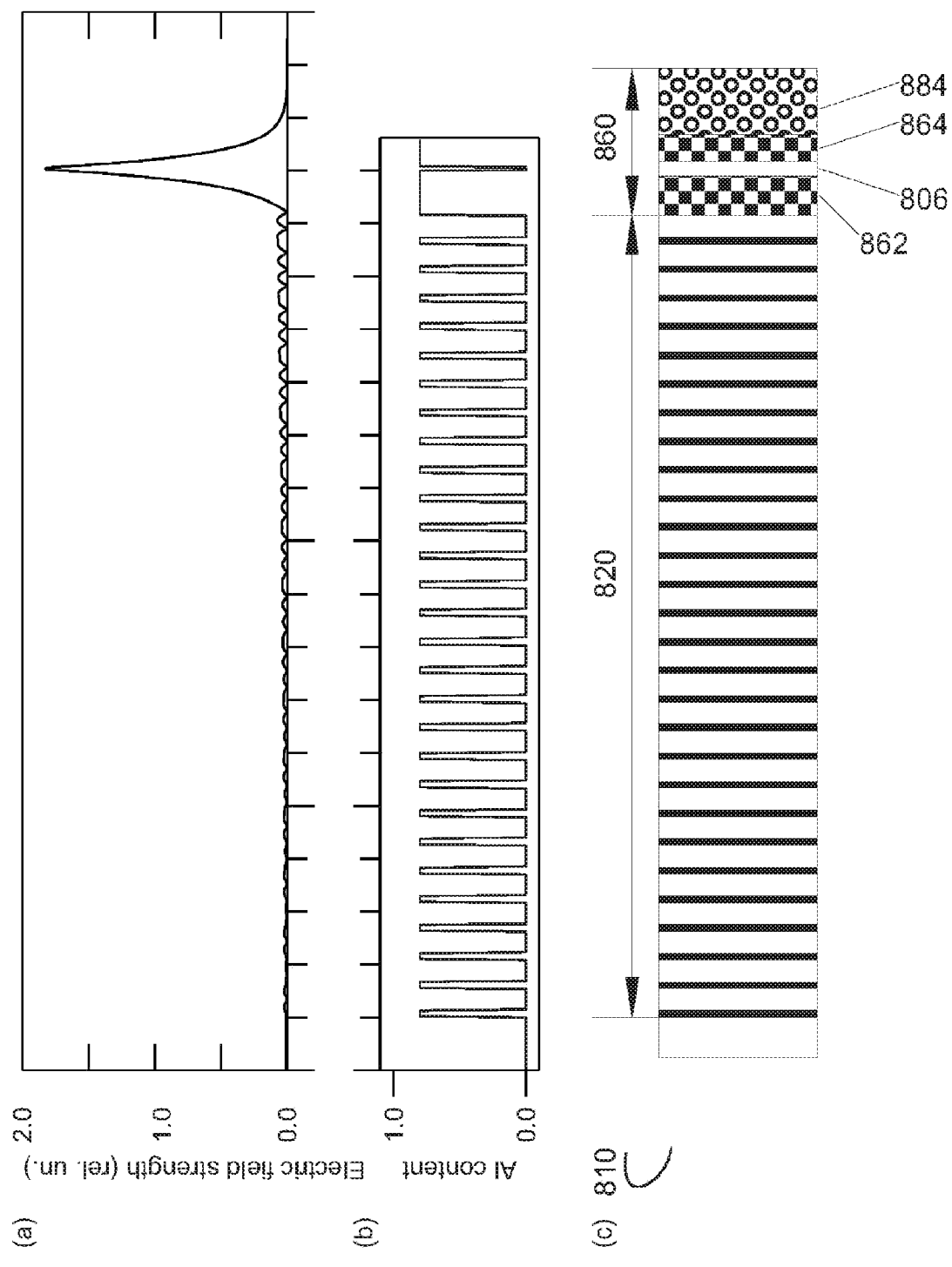
FIG. 8(a) illustrates schematically the spatial profile of the resonant optical mode of a tilted cavity laser.
FIG. 8(b) illustrates schematically the aluminum composition in the semiconductor part of the structure.
FIG. 8(c) illustrates schematically a tilted cavity laser, in which the cavity is extended by the deposition of a dielectric layer over the semiconductor part.

FIG. 8 illustrates a method for fine tuning the wavelength generated by a tilted cavity laser. FIG. 8(a) shows schematically a spatial profile of the resonant tilted optical mode, similar to FIG. 5(a). FIG. 8(b) shows schematically a spatial profile of the aluminum content for a laser based on a GaAs/GaAlAs waveguide, similar to FIG. 5(b). FIG. 8(c) shows schematically a tilted cavity laser (810) including a cavity (860) and a MIR (820). The cavity includes a semiconductor layer (862), an active region (806), a semiconductor layer (864), and a dielectric layer (884).

The electric field of the resonant optical mode decays away from the active region in the layers (864) and (884). By varying a thickness and a refractive index of the layer (884), it is possible to tune the wavelength of the resonant optical mode. The tuning is preferably realized by the following scheme.

1. A semiconductor structure is grown that terminates by the semiconductor layer (864).
2. The structure is processed, and a laser is fabricated.
3. The wavelength of the generated laser light is measured. Depending on the measured wavelength of the emitted laser light and a required wavelength, a necessary thickness of the dielectric layer is calculated.
4. The dielectric layer with a calculated thickness is deposited.

Since the additional dielectric layer is deposited remote from the cavity, it does not affect the main feature of the cavity as an antiwaveguiding cavity.

In another embodiment of the present invention, the same scheme is realized to fine tune the resonant wavelength of an optical amplifier.

In yet another embodiment of the present invention, the same scheme is realized to fine tune the resonant wavelength of a resonant photodetector.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A semiconductor optoelectronic device comprising:
   a) a cavity;
   b) at least one multilayered interference reflector;
   c) at least one p-n junction element; and
   d) a substrate;
   wherein the refractive index of the cavity is lower than a square root of a weighted average of a square of the refractive index of the multilayered interference reflector;

wherein a resonant optical mode, having a first wavelength and propagating at a first tilt angle has a first absolute value of the electric field strength at the p-n junction element and a first value of the leakage losses out of the cavity into the substrate;

wherein optical modes at a different wavelength than the first wavelength or propagating at a different angle than the first angle have a second absolute value of the electric field strength at the p-n junction element smaller than the first absolute value;

wherein the tilt angle is defined as an angle between a direction of propagation of light within the p-n junction element and a direction normal to the lateral plane; and wherein the second absolute value of the electric field strength at the p-n junction element is smaller than the first absolute value by a factor greater than 3.

2. The semiconductor optoelectronic device of claim 1, wherein the p-n junction element comprises a p-n junction.

3. The semiconductor optoelectronic device of claim 2, further comprising a bias element that applies a bias to the p-n junction.

4. The semiconductor optoelectronic device of claim 3, wherein the device is selected from the group consisting of:
   a) a diode laser, where light is generated when a forward bias is applied to the p-n junction;
   b) a resonant cavity photodetector, wherein a reverse bias is applied to the p-n junction in which a photocurrent is generated when light is absorbed;
   c) a resonant optical amplifier, where light is amplified when a forward bias is applied to the p-n junction; and
   d) a lightemitting diode, wherein light is generated when a forward bias is applied to the p-n junction.

5. The semiconductor optoelectronic device of claim 1, wherein output light goes out through a top surface of the device or through the substrate.

6. The semiconductor optoelectronic device of claim 5, wherein the device operates as a vertical cavity optoelectronic device.

7. The semiconductor optoelectronic device of claim 5, wherein the device operates as a tilted cavity optoelectronic device.

8. The semiconductor optoelectronic device of claim 1, wherein input light comes in through a top surface of the device or through the substrate.

9. The semiconductor optoelectronic device of claim 8, wherein the device operates as a vertical cavity optoelectronic device.

10. The semiconductor optoelectronic device of claim 8, wherein the device operates as a tilted cavity optoelectronic device.

11. The semiconductor optoelectronic device of claim 1, wherein the device is a diode laser selected from the group consisting of:
    a) a vertical cavity surface emitting laser; and
    b) a tilted cavity laser.

12. The semiconductor optoelectronic device of claim 1, wherein the device is a semiconductor resonant cavity photodetector selected from the group consisting of:
    a) a vertical cavity resonant photodetector; and
    b) a tilted cavity resonant photodetector.

13. The semiconductor optoelectronic device of claim 1, wherein the device is a semiconductor resonant optical amplifier selected from the group consisting of:
    a) a vertical cavity resonant optical amplifier; and
    b) a tilted cavity resonant optical amplifier.

14. The semiconductor optoelectronic device of claim 1, wherein optical modes at a different wavelength than the first wavelength or propagating at a different angle than the first angle have a second value of the leakage losses into the substrate larger than the first value of the leakage losses.

15. The semiconductor optoelectronic device of claim 14, wherein optical modes other than the resonant optical mode have leakage losses greater than 40 dB/cm.

* * * * *

UNITED STATES PATENT AND TRADEMARK OFFICE
CERTIFICATE OF CORRECTION

| | | |
|---|---|---|
| PATENT NO. | : 7,339,965 B2 | |
| APPLICATION NO. | : 11/099360 | |
| DATED | : March 4, 2008 | |
| INVENTOR(S) | : Ledentsov et al. | |

It is certified that error appears in the above-identified patent and that said Letters Patent is hereby corrected as shown below:

<u>Column 17</u>

Line 31, replace the word "lightemitting" with the words --light-emitting--

Signed and Sealed this

Third Day of June, 2008

JON W. DUDAS
*Director of the United States Patent and Trademark Office*